United States Patent
Lee et al.

(10) Patent No.: US 10,021,809 B2
(45) Date of Patent: Jul. 10, 2018

(54) AIR CONDITIONER

(71) Applicant: LG ELECTRONICS INC., Seoul (KR)

(72) Inventors: Yung Koo Lee, Changwon-si (KR);
Jong Chul Ha, Changwon-si (KR);
Dong Soo Moon, Changwon-si (KR);
Hyun Jong Kim, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 235 days.

(21) Appl. No.: 14/902,801

(22) PCT Filed: Jul. 4, 2014

(86) PCT No.: PCT/KR2014/005985
§ 371 (c)(1),
(2) Date: Jan. 4, 2016

(87) PCT Pub. No.: WO2015/002493
PCT Pub. Date: Jan. 8, 2015

(65) Prior Publication Data
US 2016/0174411 A1 Jun. 16, 2016

(30) Foreign Application Priority Data

Jul. 5, 2013 (KR) .......................... 10-2013-0079183

(51) Int. Cl.
*F28F 7/00* (2006.01)
*H05K 7/20* (2006.01)
(Continued)

(52) U.S. Cl.
CPC ........... *H05K 7/20136* (2013.01); *F24F 1/24* (2013.01); *F25B 21/02* (2013.01); *H05K 7/20254* (2013.01)

(58) Field of Classification Search
CPC ... H05K 7/20136; H05K 7/20254; F24F 1/24; F25B 21/02; F28D 2021/0028;
(Continued)

(56) References Cited

U.S. PATENT DOCUMENTS 6,009,717 A * 1/2000 Hernandez .............. F24F 1/027
62/262
8,272,229 B2 9/2012 Choi et al.
(Continued)

FOREIGN PATENT DOCUMENTS

| | | |
|---|---|---|
| EP | 2 522 931 A1 | 11/2012 |
| JP | 9-138044 A | 5/1997 |

(Continued)

*Primary Examiner* — Justin Jonaitis
(74) *Attorney, Agent, or Firm* — Dentons US LLP

(57) ABSTRACT

Disclosed in an air conditioner including a control box having a space formed therein, a PCB arranged to form an air circulation passage in the space, the PCB having a plurality of electric components mounted thereto, a cooling module for making a first electric component of the plurality of electric components to heat exchange with refrigerant, and a circulating fan arranged in the air circulation passage to make air to flow to a second electric component of the plurality of electric components after cooled by the cooling module, thereby dissipating heat from an inside of the control box with a mixed cooling system of a refrigerant cooling system and an air cooling system, efficiently.

20 Claims, 3 Drawing Sheets

(51) Int. Cl.
*F25B 21/02* (2006.01)
*F24F 1/24* (2011.01)

(58) Field of Classification Search
CPC ... F28D 2021/0029; F28D 1/06; H01L 23/40; H01L 23/46; H01L 23/467; F28F 2280/00
USPC .................................. 165/80.3, 80.2, 80.1
See application file for complete search history.

(56) References Cited

U.S. PATENT DOCUMENTS

| | | | |
|---|---|---|---|
| 2008/0000253 A1* | 1/2008 | Kim | F24F 1/025 62/291 |
| 2008/0302120 A1* | 12/2008 | Kang | F24F 1/0014 62/259.1 |
| 2009/0081940 A1* | 3/2009 | Jang | F24F 1/22 454/184 |
| 2009/0137197 A1 | 5/2009 | Jang et al. | |
| 2009/0205352 A1* | 8/2009 | Choi | F24F 1/0007 62/259.1 |
| 2012/0105790 A1* | 5/2012 | Hubbard | G02F 1/133308 349/161 |
| 2015/0271949 A1* | 9/2015 | Kim | H05K 7/20272 361/699 |

FOREIGN PATENT DOCUMENTS

| | | |
|---|---|---|
| JP | 2010-266132 A | 11/2010 |
| JP | 2011-220654 A | 11/2011 |
| KR | 10-2007-0052547 A | 5/2007 |
| KR | 10-0954358 B1 | 4/2010 |
| KR | 10-1172679 B1 | 8/2012 |
| WO | 2012/081056 A1 | 6/2012 |

* cited by examiner

[Fig. 1]
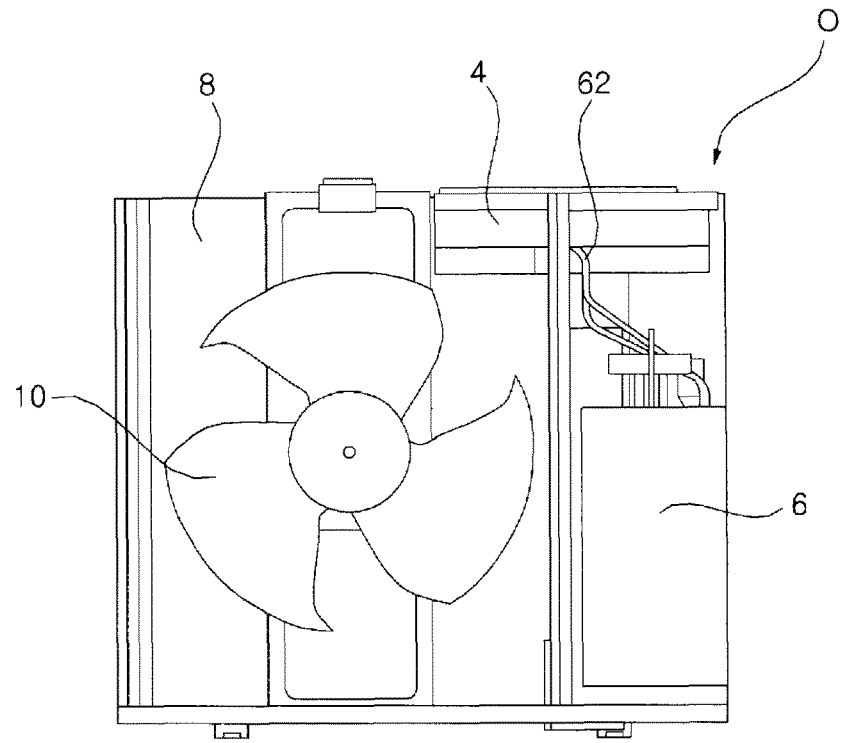
[Fig. 2]
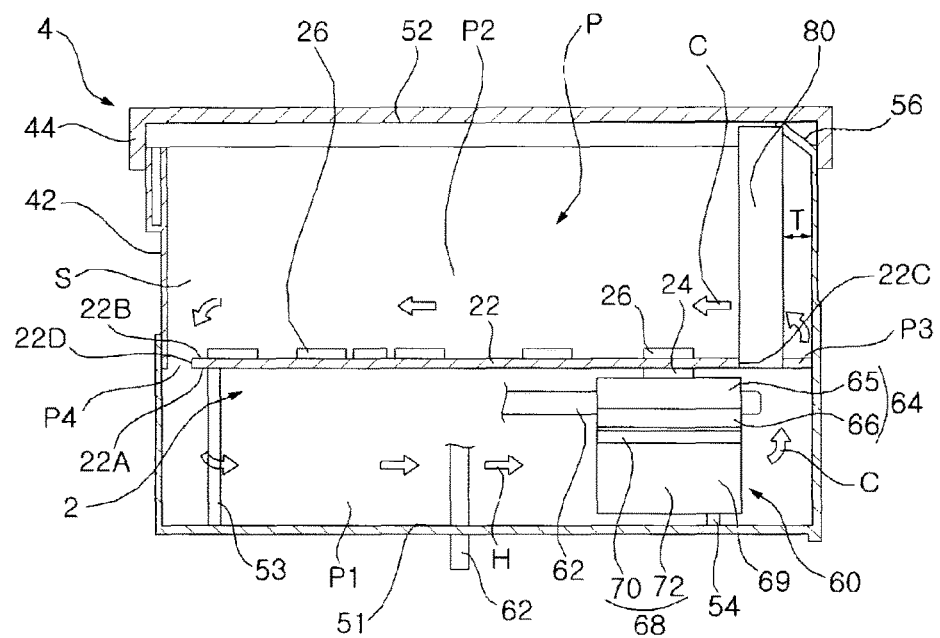

[Fig. 3]
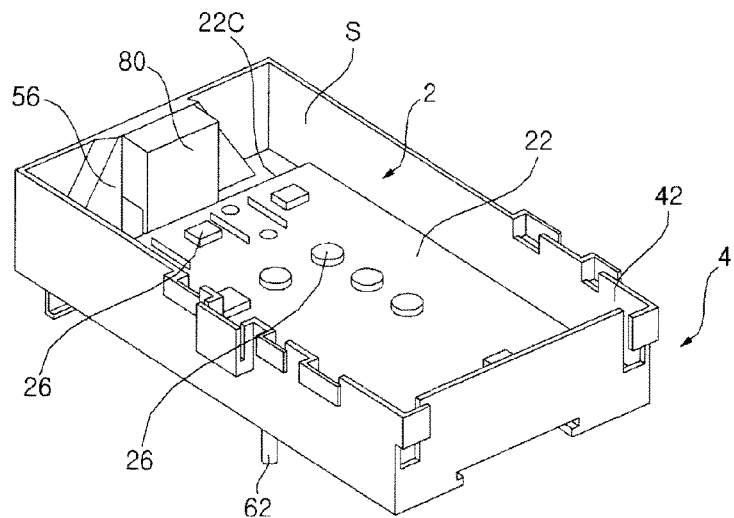
[Fig. 4]
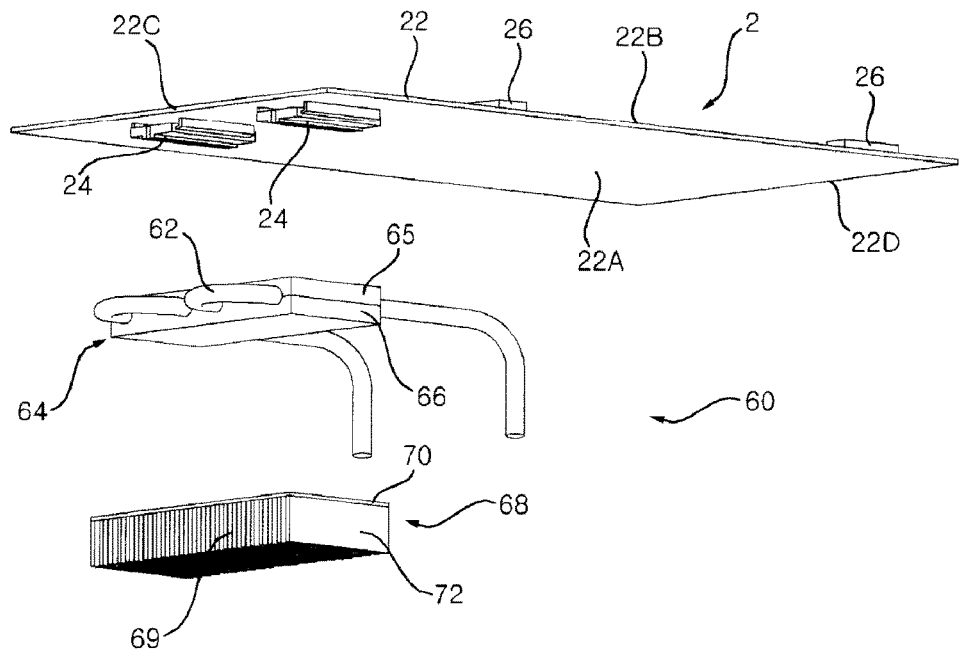

[Fig. 5]
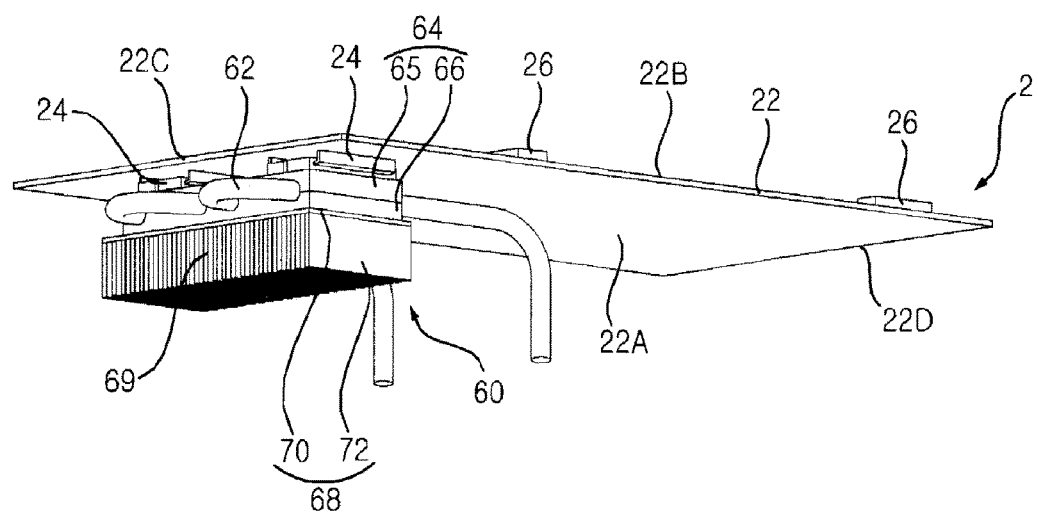

AIR CONDITIONER

This application is a 35 U.S.C. § 371 National Stage Entry of International Application No. PCT/KR2014/005985 filed Jul. 4, 2014, which claims benefit of and priority to Korean Application No. 10-2013-0079183 filed Jul. 5, 2013, both of which are incorporated by reference for all purposes as if fully set forth herein.

TECHNICAL FIELD

The present invention relates to an air conditioner. More specifically, the present invention relates to an air conditioner in which a printed circuit board (hereinafter, "PCB") mounted to a control box can be cooled.

BACKGROUND ART

In general, the air conditioner is a machine for treating air drawn thereto and supplying the air treated thus to a building or a room for maintaining room air in a comfortable condition. In the air conditioners, there are window type air conditioners and split type air conditioners.

Though identical in view of functions, the window type air conditioner has cooling and heat dissipation functions integrated to one unit for installation of the air conditioner in a recess formed in an wall of a house or in a window frame of the house directly, while the split type air conditioner has a cooling unit installed indoors, and a heat dissipation and compression unit installed outdoors, which are connected with a refrigerant pipeline.

The split type air conditioner is provided with an indoor unit having an indoor heat exchanger and indoor fan, an outdoor unit having a compressor, an outdoor heat exchanger, and an outdoor fan, and the refrigerant pipeline connected between the indoor unit and the outdoor unit.

The air conditioner may be provided with the PCB for controlling different units, such as the compressor and the fan. The PCB may be mounted to the control box.

Since an inside temperature of the control box may rise when the air conditioner is in operation, the air conditioner may have a heat dissipation device mounted thereto for heat dissipation from an inside of the control box.

The heat dissipation device may have a heat sink mounted to the control box for cooling the PCB, external air made to flow by a fan and motor assembly may be guided to the heat sink, and the PCB may be air cooled.

DISCLOSURE OF THE INVENTION

Technical Problem

A related art air conditioner has a problem in that a PCB can not be cooled efficiently if the external air blown by the fan and motor assembly has a high temperature.

Accordingly, the present invention has been made in an effort to solve the aforementioned problems, and it is an object of the present invention to provide an air conditioner which can cool the PCB efficiently even if a temperature of the external air has a high temperature.

Solution to Problem

To achieve the object of the present invention, an air conditioner includes a control box having a space formed therein, a PCB arranged to form an air circulation passage in the space, the PCB having a plurality of electric components mounted thereto, a cooling module for making a first electric component of the plurality of electric components to heat exchange with refrigerant, and a circulating fan arranged in the air circulation passage to make air to flow to a second electric component of the plurality of electric components after cooled by the cooling module.

The first electric component may have a heat generation rate higher than the second electric component.

The air circulation passage may be formed in a close loop cross section shape between the PCB and the control box.

The cooling module may include a refrigerant pipe for passing of the refrigerant, a heat transfer plate in contact with the refrigerant pipe and the first electric component, and a heat absorbing plate in contact with the heat transfer plate for heat exchange with the air in the air circulation passage.

The heat absorbing plate may be positioned between the heat transfer plate and the control box.

The heat absorbing plate may have at least one air passage formed therein for passing of the air in the space.

The circulating fan may be positioned between the first electric component and the second electric component in an air flow direction.

The PCB may partition the space into a first flow passage having the first electric component and a heat dissipation module positioned therein, and a second flow passage having the second electric component positioned therein.

The first electric component may be mounted to one side of the PCB, and the second electric component may be mounted to the other side of the PCB.

The first flow passage may be positioned between one side of an inside of the control box and one side of the PCB, and the second flow passage may be positioned between the other side of the inside of the control box and the other side of the PCB.

The air conditioner may further include a first communication passage formed between the PCB and the control box for flow of the air from the first flow passage to the second flow passage, and a second communication passage formed between the PCB and the control box for flow of the air from the second flow passage to the first flow passage.

The PCB may have one side edge spaced from the control box to form the first communication passage, and the other side edge spaced from the control box to form the second communication passage.

The circulating fan may be mounted to one of the first flow passage and the second flow passage.

The first flow passage and the second flow passage may have cross sections of the flow passages formed larger than the other one, and the circulating fan may be positioned in one of the first flow passage and the second flow passage having a flow passage cross section larger than the other one.

The air conditioner may further include a spacer for placing the PCB thereon such that the first flow passage is formed between the control box and the PCB, and the spacer may have a height formed higher than a height of the cooling module.

In another aspect of the present invention, an air conditioner includes a control box having a space formed therein, a PCB module arranged to form an air circulation passage in the space, a cooling module for making a high heat generation part of a high heat generation part and a low heat generation part of the PCB module to heat exchange with refrigerant, and a circulating fan arranged in the air circulation passage to make air to flow to the low heat generation part after cooled by the cooling module.

The cooling module may include a refrigerant pipe for passing of the refrigerant, a heat transfer plate for absorbing heat from the high heat generation part and transferring the heat to the refrigerant pipe, and a heat absorbing plate for absorbing heat from the air in the air circulation passage and transferring the heat to the heat transfer plate.

The heat absorbing plate may be positioned between the heat transfer plate and the control box.

The heat absorbing plate may have at least one air passage formed therein for passing of the air in the air circulation passage.

The heat transfer plate may include a first heat transfer plate in contact with the high heat generation part, and a second heat transfer plate in contact with the heat absorbing plate and arranged to share a contact area of the refrigerant pipe with the heat transfer plate.

Advantageous Effects of Invention

The air conditioner of the present invention is advantageous in that the inside of the control box is cooled by mixed cooling of refrigerant cooling and air cooling, efficiently.

And, the air conditioner of the present invention is advantageous in that the inside of the control box is cooled quickly without affected by an external temperature when outdoor air has a high temperature.

And, the air conditioner of the present invention is advantageous in that entire PCB and entire inside of the control box can be cooled uniformly and efficiently as the air in the control box circulates around the PCB.

And, the air conditioner of the present invention is advantageous in that the PCB can be cooled efficiently while minimizing a power consumption loss because a portion of the PCB module having a high temperature is cooled by refrigerant cooling and the other portion of the PCB module is cooled by air cooling.

BRIEF DESCRIPTION OF DRAWINGS

FIG. 1 is a front view illustrating an inside of an air conditioner in accordance with a first preferred embodiment of the present invention;

FIG. 2 is a sectional view illustrating an inside of the control box in FIG. 1;

FIG. 3 is a perspective view illustrating an inside of the control box in FIG. 1;

FIG. 4 is an exploded perspective view illustrating the PCB in FIG. 2, with a cooling module separated therefrom; and FIG. 5 is a perspective view illustrating the PCB being cooled by the cooling module in FIG. 2.

MODE FOR THE INVENTION

In what follows, an air conditioner according to a preferred embodiment of the present invention will be described in detail with reference to the appended drawings.

FIG. 1 is a front view illustrating an inside of an air conditioner in accordance with a first preferred embodiment of the present invention, FIG. 2 is a sectional view illustrating an inside of the control box in FIG. 1, FIG. 3 is a perspective view illustrating an inside of the control box in FIG. 1, FIG. 4 is an exploded perspective view illustrating the PCB in FIG. 2, with a cooling module separated therefrom, and FIG. 5 is a perspective view illustrating the PCB being cooled by the cooling module in FIG. 2.

In the embodiment, a PCB module 2 may be mounted to a control box 4 for controlling the air conditioner. The air conditioner may include a compressor 6, an outdoor heat exchanger 8, an expansion device, and an indoor heat exchanger, through which refrigerant circulates. The air conditioner may be a window type air conditioner which has the compressor, the outdoor heat exchanger, the expansion device, and the indoor heat exchanger mounted to one casing. The air conditioner may be a split type air conditioner including an outdoor unit 0 having the compressor 6, an outdoor heat exchanger 8, and an outdoor fan 10 mounted thereto, and an indoor unit having the indoor heat exchanger and the indoor fan mounted thereto.

In a case of the window type air conditioner, the PCB module 2 may control electric components of the compressor and the fan mounted to the window type air conditioner.

In a case of the split type air conditioner, the PCB module 2 and the control box 4 may be mounted to the indoor unit, and, in this case, the PCB module 2 may control electric components of the indoor fan and so on mounted to the indoor unit.

In the case of the split type air conditioner, the PCB module 2 and the control box 4 may be mounted to the outdoor unit 0, and, in this case, the PCB module 2 may control the electric components of the compressor 6, the outdoor fan 10, and so on mounted to the outdoor unit.

The air conditioner may have the PCB module 2 and the control box 4 mounted to the outdoor unit 0, and the PCB module 2 mounted to the outdoor unit 0 may be air cooled with outdoor air. In this case, if the outdoor air is at a high temperature, the PCB module 2 can not dissipate heat therefrom efficiently due to the high temperature of the outdoor air. It is preferable for the air conditioner to dissipate heat from the PCB module 2 by using refrigerant rather than by using the outdoor air.

Hereinafter, though the embodiment will be described taking an example in which the PCB module 2 and the control box 4 are mounted to the outdoor unit 0 of the split type air conditioner, the embodiment is not limited to a case in which the PCB module 2 and the control box 4 are mounted to the outdoor unit 0, but it is apparent that the embodiment is applicable to cases in which the PCB module 2 and the control box 4 are mounted to the indoor unit of the window type air conditioner or the split type air conditioner.

The PCB module 2 in the control box 4 may be cooled by the refrigerant or the air. The PCB module 2 may be arranged in a space formed in the control box 4. The PCB module 2 may include a PCB (Printed Circuit Board) 22 and a plurality of electric components 24 and 26 mounted to the PCB 22. The plurality of electric components 24 and 26 mounted to the PCB 22 may have heat generation rates different from one another depending on kinds thereof. Some 24 of the plurality of electric components 24 and 26 may construe a high heat generation part having a high heat generation rate, and other electric component 26 of the plurality of electric components 24 and 26 may construe a low heat generation part having a heat generation rate lower than the high heat generation part. The air conditioner may have the compressor 2 of an inverter compressor, and the plurality of electric components 24 and 26 may include a power supply unit for supplying power, an inverter for converting DC power to AC power, and other electric components having heat generation rates lower than the power supply unit or the inverter. The inverter or the power supply unit which has the high heat generation rate may be the first electric component 24 which is the high heat generation part, and other electric component having the heat generation rate lower than the power supply unit or the inverter may be a second electric component 26 which is the low heat generation part.

The PCB module 2 may be arranged to form an air circulation passage P in the space S. The air circulation passage P may be a passage formed within the control box 4 not to be in communication with an outside of the control box 4. The air circulation passage P may be an internal circulation passage formed to circulate the air within the control box 4. The air in the space S may cool down the PCB module 2 while circulating the air circulation passage P. The air in the space S may be air within the control box which does not mix with the external air of the control box 4. The air in the space S may be cooled by a cooling module 60 to be described later, and may circulate the air circulation passage P in a state cooled by the cooling module 60.

The control box 4 may have different components mounted thereto and protected thereby, and may have the space S formed therein. The space S may be an enclosure formed in the control box 4. The control box 4 may include a box body 42 having an opened side, and a box cover 44 which closes the opened side of the box body 42, to form the enclosure between the box body 42 and the box cover 44 which blocks in/out of the external air thereto/therefrom. The PCB module 2 in the control box 4 may be cooled, not only by refrigerant, but also by the air, wherein the air may be cooled down by the refrigerant, and flows within the control box 4 so that the air cooled down thus cools an inside of the control box 4 and the PCB module 2 while the air flows the inside of the control box 4.

It is possible that the air conditioner makes the refrigerant to heat exchange with the PCB module 2 to dissipate heat from the PCB module 2. The air conditioner may include a cooling module 60 for making the PCB module 2 to heat exchange with the refrigerant.

The cooling module 60 may be connected to a circuit of a refrigerating cycle including the compressor 6, the outdoor heat exchanger 8, the expansion device and the indoor heat exchanger. Of a low temperature portion and a high temperature portion of a refrigerating cycle circuit, the cooling module 60 may be connected to the low temperature portion of the refrigerating cycle circuit such that the refrigerant passing through the low temperature portion passes through the cooling module 60. A portion of the refrigerant passing through the low temperature portion of the refrigerating cycle circuit may flow to the cooling module 60 and passes through the cooling module 60, to dissipate heat while the refrigerant passes through the cooling module 60. The cooling module 60 may be arranged to be in contact with the PCB module 2.

The cooling module 60 may include a refrigerant pipe 62 through which the refrigerant passes, and refrigerant pipe 62 may have one end connected to the low temperature portion of the refrigerating cycle circuit. The refrigerant pipe 62 may have the other end connected to the low temperature portion of the refrigerating cycle circuit. If the PCB module 2 and the control box 4 are mounted to the outdoor unit 0, the refrigerant pipe 62 may be connected to the refrigerant pipe between the outdoor heat exchanger 8 and the expansion device or to the refrigerant pipe between the expansion device and the indoor heat exchanger. The cooling module 60 may be arranged to heat exchange with a portion of the PCB module 2. It is possible that the cooling module 60 can make the high heat generation part of the PCB module 2 to heat exchange with the refrigerant. The PCB module 2 may have the high heat generation part heat exchanged with, and cooled by, the cooling module 60 and the low heat generation part heat exchanged with the air cooled by the cooling module 60, and cooled by the air. The PCB module 2 may be cooled throughout the PCB module 2 uniformly owing to the refrigerant type cooling by the cooling module 60 and the air cooling type cooling by the air heat exchanged with the cooling module 60. The cooling module 60 may include a heat transfer plate 64 for absorbing heat from the high heat generation part and transferring the heat absorbed thus to the refrigerant pipe 62, and a heat absorbing plate 68 for absorbing heat from the air and transfer the heat absorbed thus from the air to the heat transfer plate 64.

The heat transfer plate 64 may include a first heat transfer plate 65 in contact with the high heat generation part and a second heat transfer plate 66 in contact with the heat absorbing plate 68 and arranged to share a contact area of the refrigerant pipe 62 with the first heat transfer plate 65.

The heat absorbing plate 68 may be positioned between the heat transfer plate 64 and the control box 4. The heat absorbing plate 68 may be positioned in the air circulation passage P for heat exchange with the air in the air circulation passage P. The heat absorbing plate 68 may have at least one air passage 69 formed therein for pass through of the air in the air circulation passage P. The heat absorbing plate 68 may include a contact plate 70 in contact with the heat transfer plate 64, and at least a fin 72 projected from the contact plate 70. The heat absorbing plate 68 may have a plurality of the fins 72 arranged projected from the contact plate 70, with the air passage 69 formed among the plurality of fins 72.

The air conditioner may further include a circulating fan 80 arranged in the air circulation passage P for making the air to flow such that, after the air is cooled by the cooling module 60, the air is blown toward the low heat generation part of the PCB module 2.

Hereinafter, cooling of the PCB module 2 and the control box 4 will be described, in detail.

The PCB 22 may be arranged such that the plurality of the electric components 24 and 26 are mounted thereto and the air circulation passage P is formed in the space S. The air circulation passage P may be formed in a closed loop cross section shape between the PCB 22 and the control box 4.

Of the plurality of electric components 24 and 26, the first electric component 24 may have a heat generation rate higher than the second electric component 26. The first electric component 24 and the second electric component 26 may be arranged to be positioned on sides different from each other. The first electric component 24 may be arranged on one side 22A of the PCB 22 and the second electric component 26 may be arranged on the other side 22B of the PCB 22.

The PCB 22 may partition the space S into a first flow passage P1 the first electric component 24 and the cooling module 60 are positioned therein, and a second flow passage P2 the second electric component is positioned therein. The first flow passage P1 may be positioned between one side 51 of an inside of the control box 4 and one side 22A of the PCB 22. The second flow passage P2 may be positioned between the other side 52 of the inside of the control box 4 and the other side of the PCB 22. One of the first flow passage P1 and the second flow passage P2 may have a flow passage cross section formed larger than the other one in an air flow direction.

Formed between the PCB 22 and the control box 4, there may be a first communication passage P3 for making the air in the first flow passage P1 to flow to the second flow passage P2, and a second communication passage P4 for making the air in the second flow passage P2 to flow to the first flow passage P1. The PCB 22 may have one side edge 22C spaced from the control box 4 to form the first communication passage P3 and the other side edge 22D spaced from the control box 4 to form the second communication passage P4.

The PCB 22 may be arranged in the control box 4, horizontally. The PCB 22 may have an underside spaced from a low plate of the control box 4 to form the first flow passage P1 therebetween. The PCB 22 may have an upper side spaced from an upper plate of the control box 4 to form the second flow passage P2 therebetween. The PCB 22 may have one side edge 22C spaced from one side wall of the control box 4 to form the first communication passage P3 therebetween. The PCB 22 may have the other side edge 22D spaced from the other side wall of the control box 4 to form the second communication passage P4 therebetween.

The air conditioner may include a spacer 53 and 54 to place the PCB 22 thereon to form the first flow passage P1 between the control box 4 and the PCB 22. The spacer 53 and 54 may be arranged in the control box 4. The spacer 53 and 54 may be arranged in the control box 4 for spacing the underside of the PCB 22 from the lower plate of the control box 4, and, when the PCB 22 is placed on the spacer 53 and 54, the PCB 22 may be spaced from the lower plate of the control box 4 to form the first flow passage P1 between the PCB 22 placed on the spacer 53 and 54 and the lower plate of the control box 4.

The spacer 53 and 54 may be formed to have a height higher than a height of the cooling module 60. The PCB 22 may be fastened to the control box 4 with fastening members such as screws. The spacer 53 and 54 may have fastening holes formed therein for fastening the fastening members thereto. The PCB 22 may have pass through holes formed at positions matched to the fastening holes in the spacer 53 and 54 for pass through of the fastening members. The PCB 22 may be fastened to the spacers 53 and 54 with the fastening members.

The control box 4 may have a flow passage guide 56 formed thereon for guiding the air from the first flow passage P1 to the circulating fan 80.

The control box 4 may have a refrigerant pipe pass through hole formed therein for pass through of the refrigerant pipe 62.

Of the plurality of electric components 24 and 26, the cooling module 60 may make the first electric component 24 to heat exchange with the refrigerant. The cooling module 60 may have the heat transfer plate 64 in contact with the refrigerant pipe 62 and the first electric component 24. The cooling module 60 may have the heat absorbing plate 68 in contact with the heat transfer plate 64. Of the heat transfer plate 64, the first heat transfer plate 65 may be in contact with the first electric component 24, and, of the heat transfer plate 64, the second heat transfer plate 66 may be in contact with the first heat transfer plate 65. Of the heat absorbing plate 68, the contact plate 70 may be in contact with the second heat transfer plate 66, and, of the heat absorbing plate 68, the fin 72 may be projected from the contact plate 70 toward the control box 70. The cooling module 60 may be a refrigerant cooling type cooling module in which the refrigerant pipe 62 and the heat transfer plate 64 cool the first electric component 24, or an air cooling type cooling module in which the heat absorbing plate 68 cools the air positioned in the space S of the control box 4. The air in the air circulation passage P may be cooled as the air heat exchanges with the heat absorbing plate 68. The air may be cooled as the air heat exchanges with the heat absorbing plate 68 while the air passes through the first flow passage P1, and, thereafter, may cool the second electric component 26 by air cooling while the air passes through the second flow passage P2.

The circulating fan 80 is arranged in the air circulation passage P for making the air to flow to be blown to the second electric component 26 of the plurality of electric components 24 and 26 after the air is cooled by the cooling module 60. The circulating fan 80 may be positioned between the first electric component 24 and the second electric component 26 in an air flow direction. The circulating fan 80 may be mounted to be positioned between the PCB 22 and the control box 4. The circulating fan 80 may be mounted to have a gap T to the control box 4. The circulating fan 80 may be mounted in one of the first flow passage P1 and the second flow passage P2. The circulating fan 80 may be positioned in a flow passage having a larger cross section of the first flow passage P1 and the second flow passage P2. The circulating fan 80 may be mounted to be positioned in a flow passage having a larger cross section of the first flow passage P1 and the second flow passage P2 and in the first communication passage P3. The circulating fan 80 may draw the air from the first flow passage P1 and blow the air to the second flow passage P2.

The air circulation passage P may include a low temperature region flow passage and a high temperature region flow passage. The air circulation passage P may have the low temperature region flow passage between the heat absorbing plate 68 and the first communication passage P3 and between the first communication passage P3 and the circulating fan 80 in the air flow direction, and the low temperature region flow passage may be a flow passage through which the air C cooled by the heat absorbing plate 68C passes.

The air circulation passage P may have the high temperature region flow passage between the circulating fan 80 and the second communication passage P4 and between the second communication passage P4 and the heat absorbing plate 68 in the air flow direction, and the high temperature region flow passage may be a flow passage in which the air temperature rises gradually as the air passes therethrough.

The operation of the air conditioner of the present invention having the foregoing configuration will be described.

When the air conditioner is in operation, the compressor 6 may be driven, and the outdoor fan 10 may be rotated. When the compressor 6 is driven, the refrigerant may be introduced to the compressor 6 after passing through the compressor 6, the outdoor heat exchanger 8, the expansion device and the indoor heat exchanger in succession, the outdoor heat exchanger 8 may heat exchange with the outdoor air flowed by the outdoor fan 10, and the indoor heat exchanger may make the refrigerant to heat exchange with the room air to air condition the room.

When the compressor 6 is driven, the air conditioner may have the refrigerant passing through the refrigerant pipe 62. And, when the air conditioner is in operation, the circulating fan 80 may be driven. When the circulating fan 80 is driven, the control box 4 may have an air circulation formed therein. When the refrigerant is passing through the refrigerant pipe 62, the heat may be absorbed from the heat transfer plate 64 to the refrigerant pipe 62, and the heat may be absorbed from the first electric component 24 and the heat absorbing plate 68 to the heat transfer plate 64. That is, when the refrigerant passes through the refrigerant pipe 62, the first electric component 24 and the heat absorbing plate 68 may be cooled by the heat transfer plate 64. When the circulating fan 80 is driven, the air may flow from the first flow passage P1 to the cooling module 60, particularly, the heat absorbing plate 68 to heat exchange with, and to be cooled by, the heat absorbing plate 68. The air C cooled by the heat absorbing plate 68 may pass through the first communication passage P3 thereafter, and may be drawn into the circulating fan 80. The air drawn into the circulating fan 80 may be blown to the second flow passage P2. The air C blown to the second flow passage P2 from the circulating fan 80 may cool the second electric component 26 and the second flow passage P2 as the air passes through the second flow passage P2. As the air absorbs heat while the air passes through the second flow passage P2, a temperature of the air may rise gradually, and the air may be introduced to the first flow passage P1 passed through the second communication passage P4. The air H introduced to the first flow passage P1 from the second communication passage P4 may heat exchange with the heat absorbing plate 68 again in a state the air temperature is elevated and may be cooled by the heat absorbing plate 68, again. The air in the air circulation passage P dissipates heat therefrom as the air passes through the first flow passage P1, absorbs the heat as the air passes through the second flow passage P2, to air cool the PCB module 2 and the inside of the control box 4 while repeating heat dissipation and heat absorption.

It will be apparent to those skilled in the art that the present invention is not intended to be limited to the above-described embodiment and drawings, and various changes or modifications may be made therein without departing from the scope and the technical sprit of the present invention.

The invention claimed is:
1. An air conditioner comprising:
a control box having a space formed therein;
a printed circuit board arranged to form an air circulation passage in the space, the printed circuit board having a plurality of electric components mounted thereto;
a cooling module arranged to allow for a first electric component of the plurality of electric components to heat exchange with refrigerant; and
a circulating fan arranged in the air circulation passage to make air to flow to a second electric component of the plurality of electric components after being cooled by the cooling module.

2. The air conditioner of claim 1, wherein the first electric component has a heat generation rate higher than the second electric component.

3. The air conditioner of claim 1, wherein the air is circulated through the air circulation passage in a form of a closed loop between the printed circuit board and the control box.

4. The air conditioner of claim 1, wherein the cooling module includes;
a refrigerant pipe for passing of the refrigerant,
a heat transfer plate in contact with the refrigerant pipe and the first electric component, and
a heat absorbing plate in contact with the heat transfer plate for heat exchange with the air in the air circulation passage.

5. The air conditioner of claim 4, wherein the heat absorbing plate is positioned between the heat transfer plate and the control box.

6. The air conditioner of claim 4, wherein the heat absorbing plate has at least one air passage formed therein for passing of the air in the space.

7. The air conditioner of claim 1, wherein the circulating fan is positioned between the first electric component and the second electric component in an air flow direction.

8. The air conditioner of claim 1, wherein the printed circuit board partitions the space into a first flow passage having the first electric component and a heat dissipation module positioned therein, and a second flow passage having the second electric component positioned therein.

9. The air conditioner of claim 8, wherein the first electric component is mounted to one side of the printed circuit board, and
the second electric component is mounted to the other side of the printed circuit board.

10. The air conditioner of claim 9, wherein the first flow passage is positioned between one side of an inside of the control box and one side of the printed circuit board, and
the second flow passage is positioned between the other side of the inside of the control box and the other side of the printed circuit board.

11. The air conditioner of claim 8, further comprising a first communication passage formed between the printed circuit board and the control box for flow of the air from the first flow passage to the second flow passage, and a second communication passage formed between the printed circuit board and the control box for flow of the air from the second flow passage to the first flow passage.

12. The air conditioner of claim 11, wherein the printed circuit board has one side edge spaced from the control box to form the first communication passage,
and the other side edge spaced from the control box to form the second communication passage.

13. The air conditioner of claim 8, wherein the circulating fan is mounted to one of the first flow passage and the second flow passage.

14. The air conditioner of claim 8, wherein one of the first flow passage and the second flow passage has a cross section of the flow passage formed larger than the other of the first flow passage and the second flow passage, and the circulating fan is positioned in the flow passage having the larger cross section.

15. The air conditioner of claim 8, further comprising a spacer for placing the printed circuit board thereon such that the first flow passage is formed between the control box and the printed circuit board, and
the spacer has a height formed higher than a height of the cooling module.

16. An air conditioner comprising:
a control box having a space formed therein;
a printed circuit board module arranged to form an air circulation passage in the space;
a cooling module arranged to allow for a high heat generation part of a high heat generation part and a low heat generation part of the printed circuit board module to heat exchange with refrigerant;
and a circulating fan arranged in the air circulation passage to make air to flow to the low heat generation part after cooled by the cooling module.

17. The air conditioner of claim 16, wherein the cooling module includes;
a refrigerant pipe for passing of the refrigerant, a heat transfer plate for absorbing heat from the high heat generation part and transferring the heat to the refrigerant pipe, and
a heat absorbing plate for absorbing heat from the air in the air circulation passage and transferring the heat to the heat transfer plate.

18. The air conditioner of claim 17, wherein the heat absorbing plate is positioned between the heat transfer plate and the control box.

19. The air conditioner of claim 17, wherein the heat absorbing plate has at least one air passage formed therein for passing of the air in the air circulation passage.

20. The air conditioner of claim 17, wherein the heat transfer plate includes;
- a first heat transfer plate in contact with the high heat generation part, and
- a second heat transfer plate in contact with the heat absorbing plate and arranged to share a contact area of the refrigerant pipe with the heat transfer plate.

* * * * *